(12) United States Patent
Saito

(10) Patent No.: US 10,325,905 B2
(45) Date of Patent: Jun. 18, 2019

(54) SEMICONDUCTOR DEVICE AND SEMICONDUCTOR CIRCUIT DEVICE

(71) Applicant: FUJI ELECTRIC CO., LTD., Kawasaki-shi, Kanagawa (JP)

(72) Inventor: Masaru Saito, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/969,032

(22) Filed: May 2, 2018

(65) Prior Publication Data

US 2018/0366459 A1    Dec. 20, 2018

(30) Foreign Application Priority Data

Jun. 16, 2017   (JP) .................................. 2017-118882

(51) Int. Cl.
*H01L 27/02*    (2006.01)
*H01L 29/866*   (2006.01)
(Continued)

(52) U.S. Cl.
CPC ...... *H01L 27/0255* (2013.01); *H01L 27/0259* (2013.01); *H01L 27/0274* (2013.01);
(Continued)

(58) Field of Classification Search
CPC ......... H01L 2924/12035; H01L 29/866; H01L 29/7821; H01L 29/7808; H01L 29/66106;
(Continued)

(56) References Cited

U.S. PATENT DOCUMENTS 6,674,147 B2 * 1/2004 Sakamoto ........... H01L 27/0761
257/560
8,218,276 B2 * 7/2012 Mallikarjunaswamy ....................
H01L 29/7436
361/56
(Continued)

FOREIGN PATENT DOCUMENTS

JP    H04-146660 A    5/1992
JP    2012-174983 A   9/2012
JP    2015-103605 A   6/2015

*Primary Examiner* — Scott B Geyer
(74) *Attorney, Agent, or Firm* — Rabin & Berdo, P.C.

(57) ABSTRACT

In a constant voltage clamping circuit, a p-type anode region and an n-type pickup region are provided separated from each other in an $n^-$-type well region. In the p-type anode region, a $p^-$-type low-concentration anode region is provided. In the $p^-$-type low-concentration anode region, an $n^+$-type cathode region is provided. A first Zener diode of a highest potential of the constant voltage clamping circuit is formed by a pn junction of the p-type anode region, the $p^-$-type low-concentration anode region and the $n^+$-type cathode region. An $n^+$-type pickup contact region in the n-type pickup region is arranged at a position near the $n^+$-type cathode region and separated farther the $n^+$-type cathode region, from $p^+$-type anode contact region. The $n^+$-type pickup contact region and the $p^+$-type anode contact region are short-circuited.

9 Claims, 8 Drawing Sheets

(51) Int. Cl.
*H01L 29/36* (2006.01)
*H01L 29/66* (2006.01)
*H01L 29/06* (2006.01)

(52) U.S. Cl.
CPC ............ _H01L 29/36_ (2013.01); _H01L 29/866_ (2013.01); *H01L 29/0692* (2013.01); *H01L 29/66106* (2013.01); *H01L 2924/12035* (2013.01)

(58) Field of Classification Search
CPC ............ H01L 27/0203; H01L 27/0251; H01L 27/0255; H01L 27/0248–0296; H01L 29/36; H01L 27/1021
See application file for complete search history.

(56) References Cited

U.S. PATENT DOCUMENTS

| | | | |
|---|---|---|---|
| 8,893,513 B2* | 11/2014 | June | F25B 21/00 62/3.7 |
| 9,318,482 B2* | 4/2016 | Yoo | H01L 27/0255 |
| 2007/0096261 A1* | 5/2007 | Otake | H01L 29/66106 257/603 |
| 2012/0212869 A1 | 8/2012 | Shimomura et al. | |
| 2017/0069620 A1* | 3/2017 | Tu | H01L 27/067 |

* cited by examiner

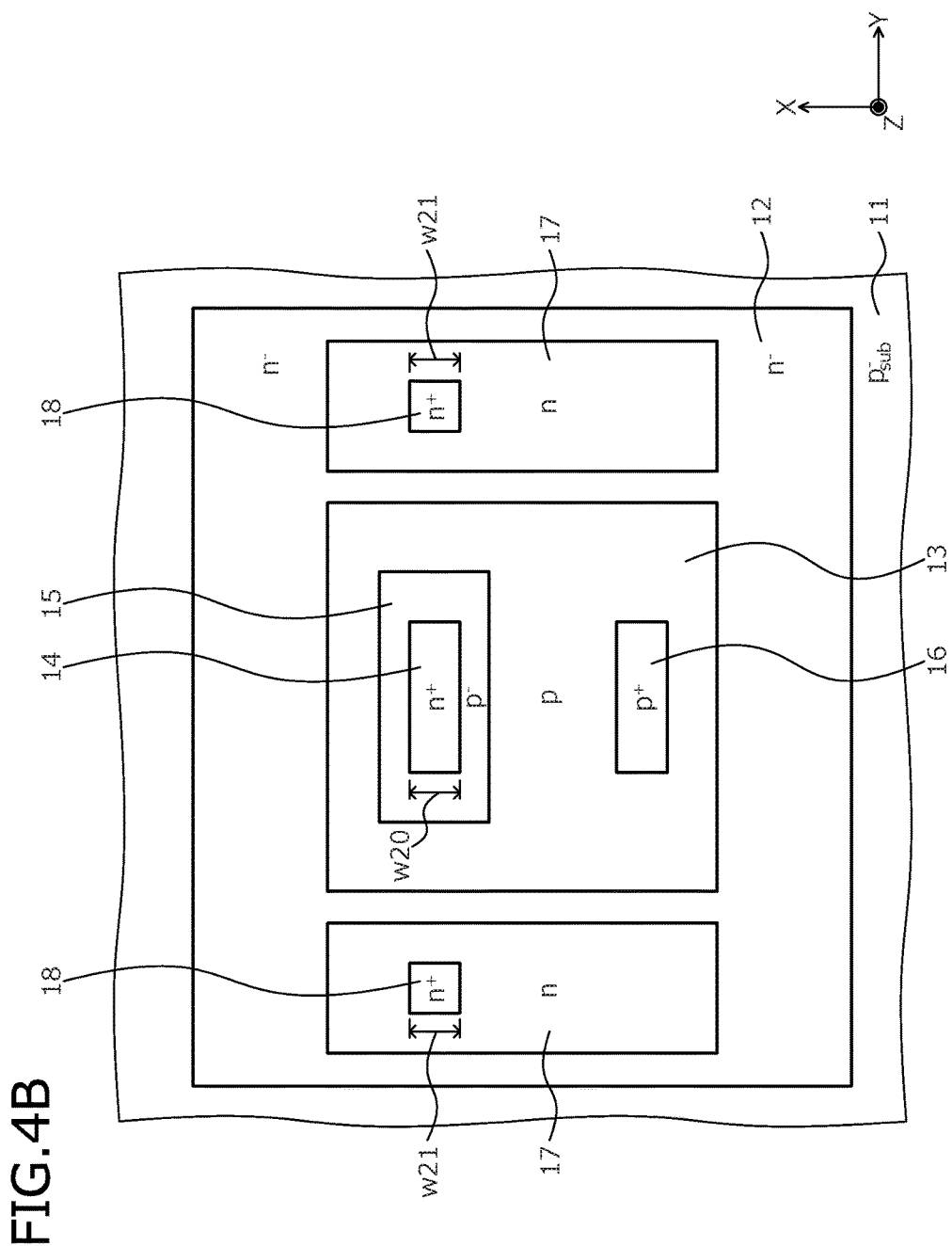

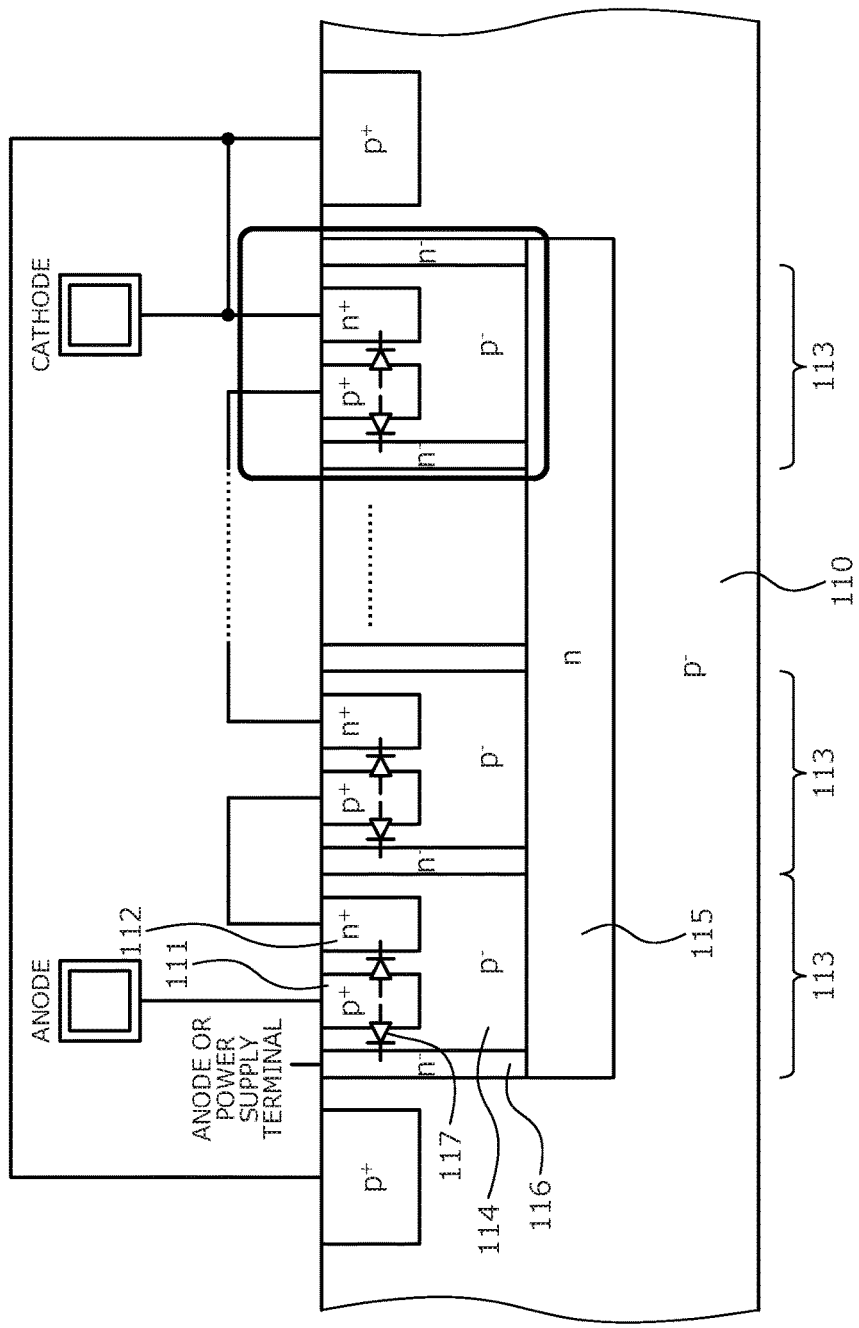

SEMICONDUCTOR DEVICE AND SEMICONDUCTOR CIRCUIT DEVICE

CROSS REFERENCE TO RELATED APPLICATIONS

This application is based upon and claims the benefit of priority of the prior Japanese Patent Application No. 2017-118882, filed on Jun. 16, 2017, the entire contents of which are incorporated herein by reference.

BACKGROUND OF THE INVENTION

1. Field of the Invention

Embodiments of the present invention relate to a semiconductor device and a semiconductor circuit device.

2. Description of the Related Art

Surge voltage is easily applied to a wiring line (hereinafter, power supply line) of a power supply potential. Therefore, generally, a constant voltage clamping circuit is used that clamps (limits) voltage of a power supply line at a predetermined voltage (hereinafter, clamp voltage), whereby surge voltage is prevented from being input to circuits connected to the power supply line. In general, a constant voltage clamping circuit is made up of plural Zener diodes connected in series between a wiring line (power supply line) of a potential Vd and a wiring line (hereinafter, ground line) of a ground potential GND. A sum of the voltage load at the Zener diodes that make up the constant voltage clamping circuit is the clamp voltage (for example, refer to Japanese Laid-Open Patent Publication No. 2012-174983, Japanese Laid-Open Patent Publication No. 2015-103605).

A maximum current capacity of the constant voltage clamping circuit made up in this manner by plural Zener diodes serially connected is determined by a current capacity of a Zener diode connected at a highest power supply potential (highest potential). A reason for this is as follows. A parasitic element is present in a Zener diode formed by a pn junction in a semiconductor substrate (semiconductor chip and at the Zener diode operating at the highest potential among the plural Zener diodes configuring the constant voltage clamping circuit, the parasitic element thereof tends to operate (parasitic operation) first. Large current tends to flow at a location of this parasitic operation and since heat is generated locally, an element where this heat concentrates may be destroyed.

FIG. 6 is a circuit diagram of an example of a semiconductor circuit device having a conventional constant voltage clamping circuit. FIG. 6 corresponds to FIG. 1 in Japanese Laid-Open Patent Publication No. 2012-174983. In the conventional semiconductor circuit device depicted in FIG. 6, an electrostatic discharge (ESD) protection circuit 104 and an output transistor 105 are connected in parallel between an output terminal 102 and a ground terminal 103. The ESD protection circuit 104 has a bipolar transistor 107 and plural Zener diodes 106 connected serially between a base of the bipolar transistor 107 and the output terminal 102. Reference numeral 101 is an external power supply terminal.

The output transistor 105, irrespective of output of an internal circuit 108, is turned OFF by a low-level gate signal output from an NOR circuit 109 when ESD is applied. When the output transistor 105 is OFF and the potential of the output terminal 102 increases, the Zener diode 106 breaks down, and base current is supplied from the output terminal 102 to the bipolar transistor 107, whereby the bipolar transistor 107 turns ON. As a result, the ESD load applied to the output terminal 102 is consumed by the bipolar transistor 107 that is in an ON state and the output transistor 105 that is in an OFF state is protected from the ESD load.

FIG. 7 is a cross-sectional view of another example of a semiconductor circuit device having a conventional constant voltage clamping circuit. FIG. 7 corresponds to FIG. 1 in Japanese Laid-Open Patent Publication No. 2015-103605. In the conventional semiconductor circuit device depicted in FIG. 7, a horizontal diode 113 made up of a pn junction of a $p^+$-type region 111 and an $n^+$-type region 112 is arranged in plural in a surface layer of a front surface of a $p^-$-type semiconductor substrate 110 (portion surrounded by thick-lined frame is one cell of the horizontal diode 113), the plural horizontal diodes 113 are connected serially, whereby an ESD protection circuit is configured. The horizontal diodes 113 are each junction isolated by n-type regions (a deep n-type well region 115 and an $n^-$-type well region 116) each covering, in the semiconductor substrate 110, formation regions 114 of the horizontal diodes 113.

The deep n-type well region 115 is provided a predetermined depth from a front surface of the semiconductor substrate 110 and faces all of the horizontal diodes 113 in a depth direction. The depth direction is a direction from the front surface of the semiconductor substrate 110 toward a rear surface. The $n^-$-type well region 116 is provided to a depth reaching the deep n-type well region 115 from the front surface of the semiconductor substrate 110. Further, the $n^-$-type well region 116 surrounds a periphery of each of the formation regions 114 for the horizontal diodes 113 in the semiconductor substrate 110. The deep n-type well region 115 and the $n^-$-type well region 116 are connected to a power supply terminal or an anode of the ESD protection circuit.

During normal operation of the semiconductor circuit device, voltage higher than voltage supplied to the anode of the ESD protection circuit is supplied to the deep n-type well region 115. As a result, a parasitic diode 117 formed by a pn junction of the $p^+$-type region 111 configuring the horizontal diode 113 (the horizontal diode 113 connected to the highest potential and arranged farthest on the left-side in FIG. 7) of a first stage and the deep n-type well region 115 and the $n^-$-type well region 116, is prevented from turning ON and a flow of leak current is prevented from the anode of the ESD protection circuit, through the parasitic diode 117, to a node (connection point) to which the deep n-type well region 115 and the $n^-$-type well region 116 are connected.

Further, as another semiconductor circuit device having a conventional constant voltage clamping circuit, a circuit device has been proposed that includes, as a protection circuit, a vertical diode made up of a pn junction of a $p^{++}$-type region selectively provided in a surface layer of a front surface of an epitaxial substrate and an $n^+$-type region selectively provided in the $p^{++}$-type region (for example, refer to Japanese Laid-Open Patent Publication No. H4-146660 (from line 7 of upper right column on page 3 to line 16 of lower right column on page 3, FIG. 1)). In Japanese Laid-Open Patent Publication No. H4-146660, a pn junction concentration difference between the $p^{++}$-type region and the $n^+$-type region is adjusted by a $p^+$-type region provided between the $p^{++}$-type region and the $n^+$-type region constituting the vertical diode, whereby a protection circuit having low discharge resistance variation is implemented.

SUMMARY OF THE INVENTION

According to an embodiment of the present invention, a semiconductor device includes a first first-conductivity-type region of a first conductivity type selectively provided in a surface layer of a front surface of a semiconductor substrate; a first semiconductor region of a second conductivity type selectively provided in the first first-conductivity-type region; a second semiconductor region of the second conductivity type selectively provided in the first semiconductor region, an impurity concentration of the second semiconductor region being lower than an impurity concentration of the first semiconductor region; a third semiconductor region of the first conductivity type selectively provided in the second semiconductor region; a fourth semiconductor region of the second conductivity type selectively provided in the first semiconductor region, the fourth semiconductor region being provided separated from the second semiconductor region, an impurity concentration of the fourth semiconductor region being higher than the impurity concentration of the first semiconductor region; a fifth semiconductor region of the first conductivity type selectively provided in the first first-conductivity-type region, the fifth semiconductor region being provided separated from the first semiconductor region; a sixth semiconductor region of the first conductivity type selectively provided in the fifth semiconductor region, an impurity concentration of the sixth semiconductor region being higher than an impurity concentration of the fifth semiconductor region; a second-conductivity-type region that is a part of the semiconductor substrate excluding the first first-conductivity-type region; a first electrode electrically connected to the third semiconductor region; and a second electrode electrically connected to the fourth semiconductor region and the sixth semiconductor region. The sixth semiconductor region is arranged at a position that is a greater distance from the fourth semiconductor region than from the third semiconductor region and on a same side of the fourth semiconductor region as the third semiconductor region.

In the embodiment, the sixth semiconductor region is arranged at a position relatively near the third semiconductor region.

In the embodiment, the sixth semiconductor region faces the fourth semiconductor region with the third semiconductor region therebetween.

According to an embodiment of the present invention, a semiconductor circuit device includes a first circuit including diodes connected serially. The diodes include a first diode of a highest potential thereamong. The first diode is a semiconductor device that includes a first first-conductivity-type region of a first conductivity type selectively provided in a surface layer of a front surface of a semiconductor substrate; a first semiconductor region of a second conductivity type selectively provided in the first first-conductivity-type region; a second semiconductor region of the second conductivity type selectively provided in the first semiconductor region, an impurity concentration of the second semiconductor region being lower than an impurity concentration of the first semiconductor region; a third semiconductor region of the first conductivity type selectively provided in the second semiconductor region; a fourth semiconductor region of the second conductivity type selectively provided in the first semiconductor region, the fourth semiconductor region being provided separated from the second semiconductor region, an impurity concentration of the fourth semiconductor region being higher than the impurity concentration of the first semiconductor region; a fifth semiconductor region of the first conductivity type selectively provided in the first first-conductivity-type region, the fifth semiconductor region being provided separated from the first semiconductor region; a sixth semiconductor region of the first conductivity type selectively provided in the fifth semiconductor region, an impurity concentration of the sixth semiconductor region being higher than an impurity concentration of the fifth semiconductor region; a second-conductivity-type region that is a part of the semiconductor substrate excluding the first first-conductivity-type region; a first electrode electrically connected to the third semiconductor region; and a second electrode electrically connected to the fourth semiconductor region and the sixth semiconductor region. The sixth semiconductor region is arranged at a position that is a greater distance from the fourth semiconductor region than from the third semiconductor region and on a same side of the fourth semiconductor region as the third semiconductor region. The semiconductor circuit device further includes a first terminal; a second terminal of a potential lower than a potential of the first terminal; and a second circuit connected between the first terminal and the second terminal. The first circuit is connected between the first terminal and the second circuit, in parallel with the second circuit. The diodes are connected serially between the first terminal and the second terminal, each having a cathode on a first terminal side and an anode on a second terminal side. The first electrode is electrically connected to the first terminal. The second electrode is electrically connected to the cathode of a second diode that is nearest the first terminal, among the diodes excluding the first diode.

In the embodiment, a diode of the diodes excluding the first diode includes a second first-conductivity-type region of the first conductivity type selectively provided in the surface layer of the front surface of the semiconductor substrate, the second first-conductivity-type region being provided separated from the first first-conductivity-type region; a seventh semiconductor region of the second conductivity type selectively provided in the second first-conductivity-type region; an eighth semiconductor region of the first conductivity type selectively provided in the seventh semiconductor region; a ninth semiconductor region of the second conductivity type selectively provided in the seventh semiconductor region, the ninth semiconductor region being provided separated from the eighth semiconductor region, an impurity concentration of the ninth semiconductor region being higher than an impurity concentration of the seventh semiconductor region; a tenth semiconductor region of the first conductivity type selectively provided in the second first-conductivity-type region, the tenth semiconductor region being provided separated from the seventh semiconductor region, an impurity concentration of the tenth semiconductor region being higher than an impurity concentration of the second first-conductivity-type region; a third electrode electrically connected to the eighth semiconductor region and the tenth semiconductor region; and a fourth electrode electrically connected to the ninth semiconductor region.

In the embodiment, the third electrode of the second diode is electrically connected to the second electrode.

In the embodiment, the fourth electrode of the diode nearest the second terminal among the diodes is electrically connected to the second terminal.

In the embodiment, the first terminal is a power supply terminal. The second terminal is a ground terminal. The first circuit is a protection circuit protecting the second circuit from overvoltage applied to the first terminal.

In the embodiment, the third semiconductor region is arranged between the sixth semiconductor region and the fourth semiconductor region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 4B is a plan view of an example of a layout of the semiconductor circuit device according to the embodiment depicted in FIG. 2 as viewed from a front surface side of a semiconductor substrate;

FIG. 7 is a cross-sectional view of another example of a semiconductor circuit device having a conventional constant voltage clamping circuit.

DETAILED DESCRIPTION OF THE INVENTION

Figure 1:
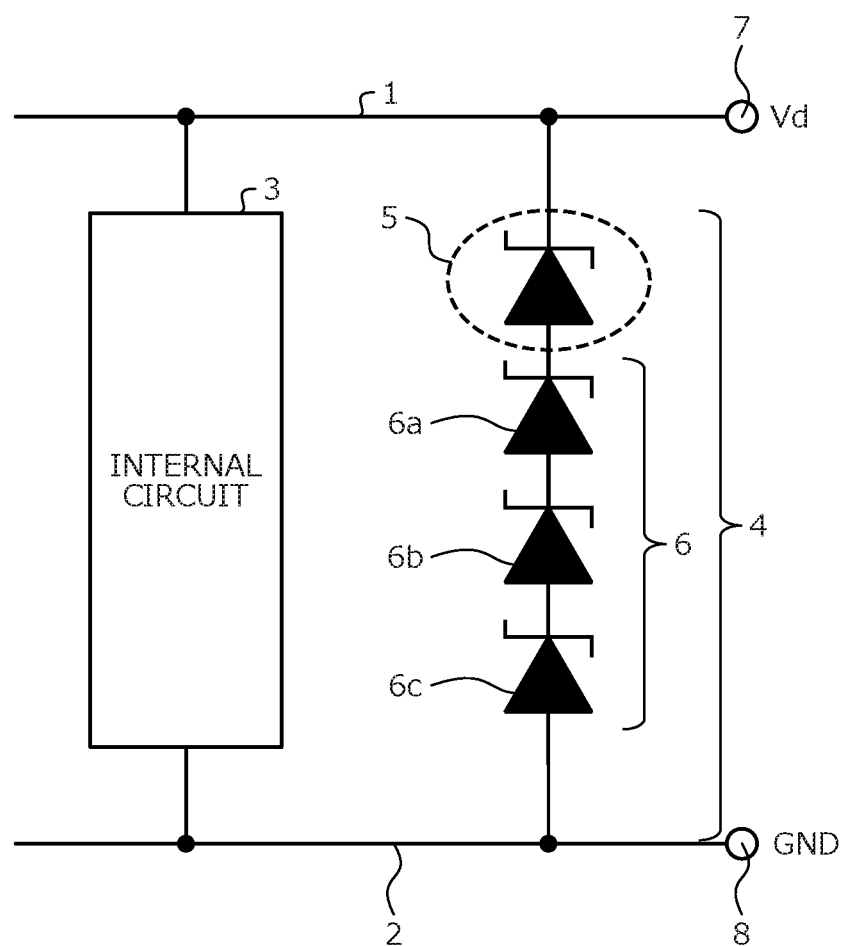
FIG. 1 is a circuit diagram of an example of circuit configuration using a semiconductor circuit device according to an embodiment.

First, problems related to the conventional techniques will be described. In the semiconductor circuit device having the described conventional constant voltage clamping circuit, in general, a bipolar device such as a Zener diode is made up of a self-isolated CDMOS (complementary and double-diffused metal oxide semiconductor) technology. In this case, a structure in which no parasitic operation occurs that forms a current path along which short-circuit current flows between a power supply terminal and a ground terminal is not feasible.

To suppress the parasitic operation of a parasitic element formed in the bipolar device, an allowed current capacity for the parasitic element to transition to parasitic operation has to be increased. However, a size (element dimensions) of the bipolar device has to be increased and current density of the bipolar device has to be reduced. Nonetheless, when the size of the bipolar device increases, chip area (chip size) increases, leading to a new problem of increased cost accompanying increases in the chip area.

Embodiments of a semiconductor circuit device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A structure of the semiconductor circuit device according to an embodiment will be described. FIG. 1 is a circuit diagram of an example of circuit configuration using the semiconductor circuit device according to the embodiment. As depicted in FIG. 1, an internal circuit (second circuit) 3 and a constant voltage clamping circuit (first circuit) 4 are connected in parallel between a wiring line (power supply line) 1 of a power supply potential Vd and a wiring line (hereinafter, ground line) 2 of the ground potential GND. During normal operation of the internal circuit 3, voltage of the power supply potential Vd is applied to the power supply line 1 from a main power supply terminal (first terminal) 7. The ground line 2 is fixed at a ground potential GND of a ground terminal (second terminal) 8. The internal circuit 3, for example, operates using the power supply potential Vd as a maximum potential and using the ground potential GND as a minimum potential.

The constant voltage clamping circuit 4 is the semiconductor circuit device according to the embodiment and is made up of one first Zener diode (first diode) 5 and plural second Zener diodes (second diodes) 6 connected serially. The constant voltage clamping circuit 4 has a function of clamping (limiting) voltage of the power supply line 1 at a predetermined voltage (clamp voltage), and preventing input of surge voltage exceeding a breakdown voltage (withstand voltage) of the internal circuit 3. The breakdown voltage is voltage of a limit that does not cause destruction or malfunction of a circuit or element. The surge voltage is overvoltage (noise) such as electrostatic discharge (ESD) input transiently to the power supply line 1.

A maximum current capacity of the constant voltage clamping circuit 4 is determined by a current capacity of the first Zener diode 5 farthest on the power supply line 1 side (side of highest potential: first stage) among the first and second Zener diodes 5, 6 configuring the constant voltage clamping circuit 4. In FIG. 1, a case is depicted where downstream from (on a low potential side of) the first Zener diode 5, three (3) second Zener diodes 6 are connected serially, and these three (second to fourth stage) second Zener diodes 6 are assigned reference numerals 6a to 6c in descending order of potential (similarly, in FIG. 5).

A cathode of the first Zener diode 5 is connected to the power supply line 1 between the main power supply terminal 7 and a power supply terminal of the internal circuit 3. A cathode of the second Zener diode 6a having a highest potential among the second Zener diodes 6a to 6c is connected to an anode of the first Zener diode 5. Cathodes of the second Zener diodes 6b, 6c respectively having lower potentials than the second Zener diodes 6a, 6b are respectively connected to anodes of the second Zener diodes 6a, 6b. An anode of the second Zener diode 6c farthest on the ground line 2 side (low potential side) is connected to the ground line 2.

The clamp voltage is a sum of the voltage load at the single first Zener diode 5 and the plural second Zener diodes 6. In other words, the number of the second Zener diodes 6 is determined according to the clamp voltage set at the constant voltage clamping circuit 4. For example, when operating voltage of the internal circuit 3 is 28V, the constant voltage clamping circuit 4 is configured by serially connecting four (4) second Zener diodes 6 of about 6V to the first Zener diode 5 of about 6V, enabling the clamp voltage to be set at about 30V (=5 Zener diodes×6V).

Figure 2:
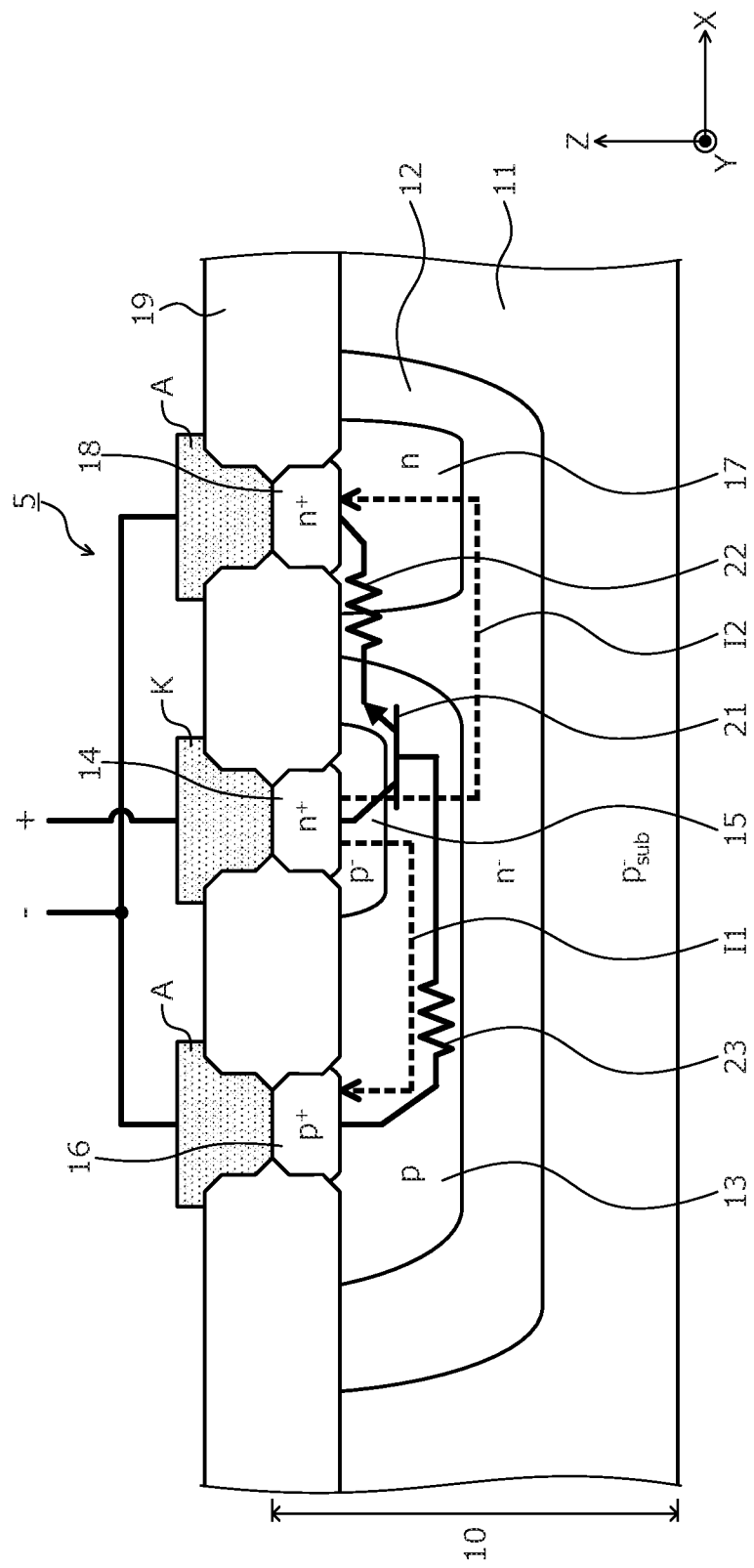
FIG. 2 is a cross-sectional view of a structure of the semiconductor circuit device according to the embodiment.

A cross-sectional view of a structure of the first Zener diode 5 is depicted in FIG. 2. FIG. 2 is a cross-sectional view of the structure of the semiconductor circuit device according to the embodiment. In FIG. 2, a conductivity type of a p⁻-type semiconductor substrate (semiconductor chip) 10 is indicated as $p^-_{sub}$ (similarly in FIGS. 3, 4A, 4B, and 5). As depicted in FIG. 2, the first Zener diode 5 is a horizontal diode formed by a pn junction of an n⁺-type cathode region (third semiconductor region) 14 and a p⁻-type low-concentration anode region (second semiconductor region) 15 and a p-type anode region (first semiconductor region) 13 selectively formed in substrate front surface (front surface of the semiconductor substrate 10) side. The horizontal diode has an anode electrode A and a cathode electrode K on the substrate front surface side.

In particular, in a surface layer of the front surface of the semiconductor substrate 10, an n⁻-type well region (first first-conductivity-type region) 12 is selectively provided. The n⁻-type well region 12 is a diffusion region formed by diffusion of an n-type impurity implanted in the semiconductor substrate 10. Reference numeral 11 is a p⁻-type region (hereinafter, p⁻-type substrate region) remaining at a deep part of the semiconductor substrate 10 toward a rear surface of the semiconductor substrate 10 and at a part of the semiconductor substrate 10 surrounding peripheries of the n⁻-type well region 12 and an n⁻-type well region 43 described hereinafter, as a result of selective formation of the n⁻-type well region 12 in the surface layer of the front surface of the p⁻-type semiconductor substrate 10. The n⁻-type well region 12 has a function of preventing short-circuiting of the n⁺-type cathode region 14 and the p⁻-type substrate region (second-conductivity-type region) 11 at the ground potential GND, and a function of fixing the n⁺-type cathode region 14 at a predetermined potential.

The p⁻-type substrate region 11 and the n⁻-type well region 12 are junction isolated by a pn junction of the p⁻-type substrate region 11 and the n⁻-type well region 12. As a result, reductions in cost may be facilitated as compared to a case where the p⁻-type substrate region 11 and the n⁻-type well region 12 are, for example, insulation isolated by a Silicon on Insulator (SOI) technology. Further, a predetermined breakdown voltage of the first Zener diode 5 is secured by a depletion layer that spreads to the p⁻-type substrate region 11 and the n⁻-type well region 12, from the pn junction of the p⁻-type substrate region 11 and the n⁻-type well region 12.

The p-type anode region 13 and an n-type pickup region (fifth semiconductor region) 17 are each selectively formed in the n⁻-type well region 12, in a surface layer on the substrate front surface side. The p-type anode region 13 is a diffusion region formed by diffusion of a p-type impurity implanted in the n⁻-type well region 12. A periphery of the p-type anode region 13 in the semiconductor substrate 10 is covered by a part of the n⁻-type well region 12 excluding the p-type anode region 13. The n⁺-type cathode region 14, the p⁻-type low-concentration anode region 15, and a p⁺-type anode contact region (fourth semiconductor region) 16 are each selectively provided in the p-type anode region 13.

Figure 5:
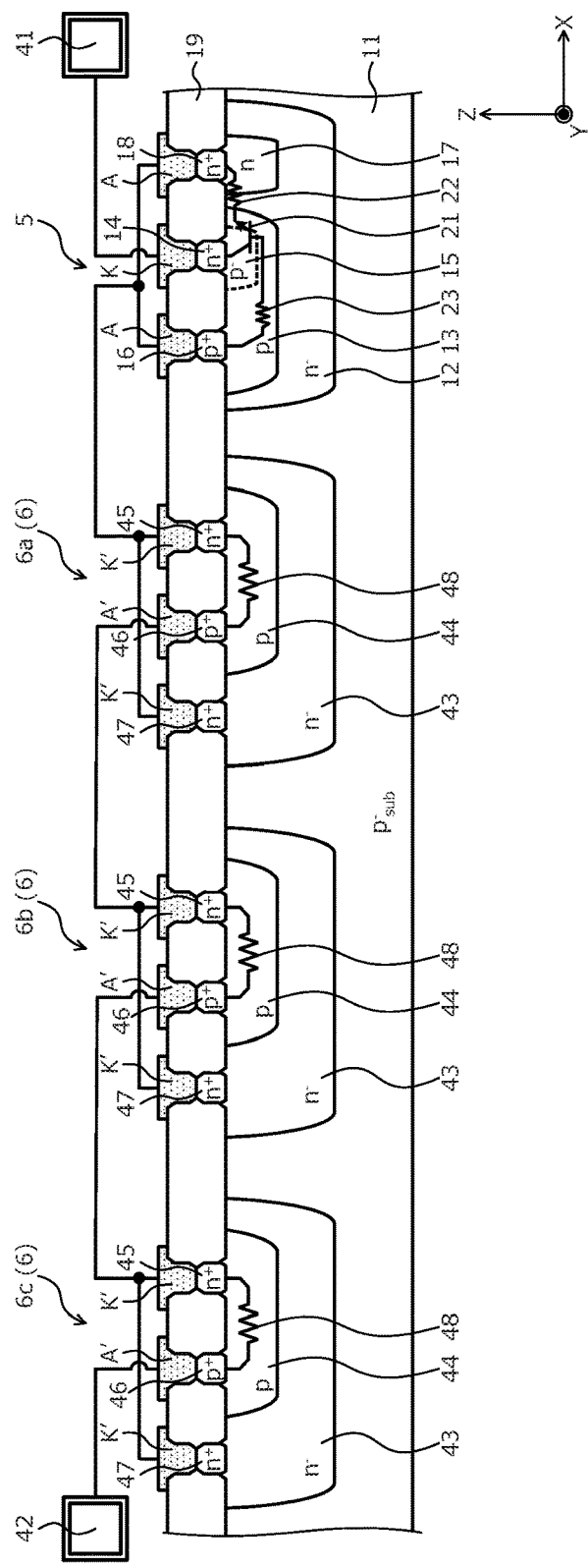
FIG. 5 is a cross-sectional view of a structure of second Zener diodes depicted in FIG. 1.

The n⁺-type cathode region 14 is exposed at the front surface of the semiconductor substrate 10 and is electrically connected to the power supply line 1, via the cathode electrode K and a cathode pad 41 (electrode pad, refer to FIG. 5). The n⁺-type cathode region 14 is a diffusion region formed by diffusion of an n-type impurity implanted in the p⁻-type low-concentration anode region 15. A periphery of the n⁺-type cathode region 14 in the semiconductor substrate 10 is covered by a part of the p⁻-type low-concentration anode region 15 excluding the n⁺-type cathode region 14.

The p⁻-type low-concentration anode region 15 is a diffusion region formed by diffusion of an n-type impurity implanted in the p-type anode region 13. In other words, the p⁻-type low-concentration anode region 15 is a region formed by partially reducing an impurity concentration of the p-type anode region 13 by diffusing an n-type impurity in the p-type anode region 13. Provision of the p⁻-type low-concentration anode region 15 enables an impurity concentration difference of the n-type impurity and the p-type impurity at a pn junction interface of a p-type region (the p⁻-type low-concentration anode region 15 and the p-type anode region 13) and an n-type region (the n⁺-type cathode region 14) forming a pn junction of the first Zener diode 5, to be increased. As a result, carriers (holes) injected to the p-type anode region 13 from the n⁺-type cathode region 14 increase, whereby majority carrier injection between the n⁺-type cathode region 14 and the p-type anode region 13 is mutually facilitated (i.e., injection efficiency of majority carriers increases). In addition, the p-type impurity concentration at the pn junction interface of the first Zener diode 5 is lower than the n-type impurity concentration, whereby movement of electrons from the n⁺-type cathode region 14 to the p⁻-type low-concentration anode region 15 is facilitated and carrier recombination at the pn junction interface of the n⁺-type cathode region 14 and the p⁻-type low-concentration anode region 15 is reduced.

The p⁺-type anode contact region 16 is a diffusion region formed by diffusion of a p-type impurity implanted in the p-type anode region 13. Further, the p⁺-type anode contact region 16 is provided separated from the n⁺-type cathode region 14 and the p⁻-type low-concentration anode region 15. The p⁺-type anode contact region 16 is exposed at the front surface of the semiconductor substrate 10 and, via the anode electrode A, is electrically connected to a cathode electrode K' of the second Zener diode 6a having a lower potential than the first Zener diode 5. In FIG. 2, "+" (plus sign) is indicated at wiring for the cathode electrode K of the first Zener diode 5, which is at a higher potential than the anode electrode A of the first Zener diode 5 and "−" (minus sign) is indicated at wiring for the anode electrode A.

In FIG. 2 and similarly in FIG. 5, the cathode electrode K is a metal wiring layer in contact with the n⁺-type cathode region 14, via a contact hole penetrating an interlayer insulating film 19 in a depth direction Z. The anode electrode A is a metal wiring layer in contact with the p⁺-type anode contact region 16 and an n⁺-type pickup contact region (sixth semiconductor region) 18 described hereinafter, via contact holes. The depth direction Z is a direction from the front surface of the semiconductor substrate 10 toward the rear surface thereof.

The n-type pickup region 17 is a diffusion region formed by diffusion of an n-type impurity implanted in the n⁻-type well region 12. A periphery of the n-type pickup region 17 in the semiconductor substrate 10 is covered by a part of the n⁻-type well region 12 excluding the n-type pickup region 17. Further, the n-type pickup region 17 is provided separated from the p-type anode region 13. Provision of the n-type pickup region 17 enables resistance (diffusion resistance) 22 of a current path of an electron current I2 flowing in the n⁻-type well region 12 at the time of operation of a parasitic npn bipolar transistor 21 described hereinafter, to be reduced.

The n⁺-type pickup contact region 18 is selectively provided in the n-type pickup region 17. The n⁺-type pickup contact region 18 is a diffusion region formed by diffusion of an n-type impurity implanted in the n-type pickup region 17. Further, the n⁺-type pickup contact region 18 is exposed at the front surface of the semiconductor substrate 10 and is electrically connected to the p⁺-type anode contact region 16, via the anode electrode A.

The n⁺-type pickup contact region 18 is arranged at a position that is near the n⁺-type cathode region 14 and separated farther than the n⁺-type cathode region 14, from the p⁺-type anode contact region 16. In other words, the n⁺-type pickup contact region 18 is arranged at a position at a greater linear distance from the p⁺-type anode contact region 16 than from the n⁺-type cathode region 14 and on a same side of the p⁺-type anode contact region 16 as the n⁺-type cathode region 14. The n⁺-type pickup contact region 18 may be arranged on an opposite side of the n⁺-type cathode region 14 from that facing toward the p⁺-type anode contact region 16 so as to sandwich the n⁺-type cathode region 14 with the p⁺-type anode contact region 16. A reason for this is as follows.

Figure 3:
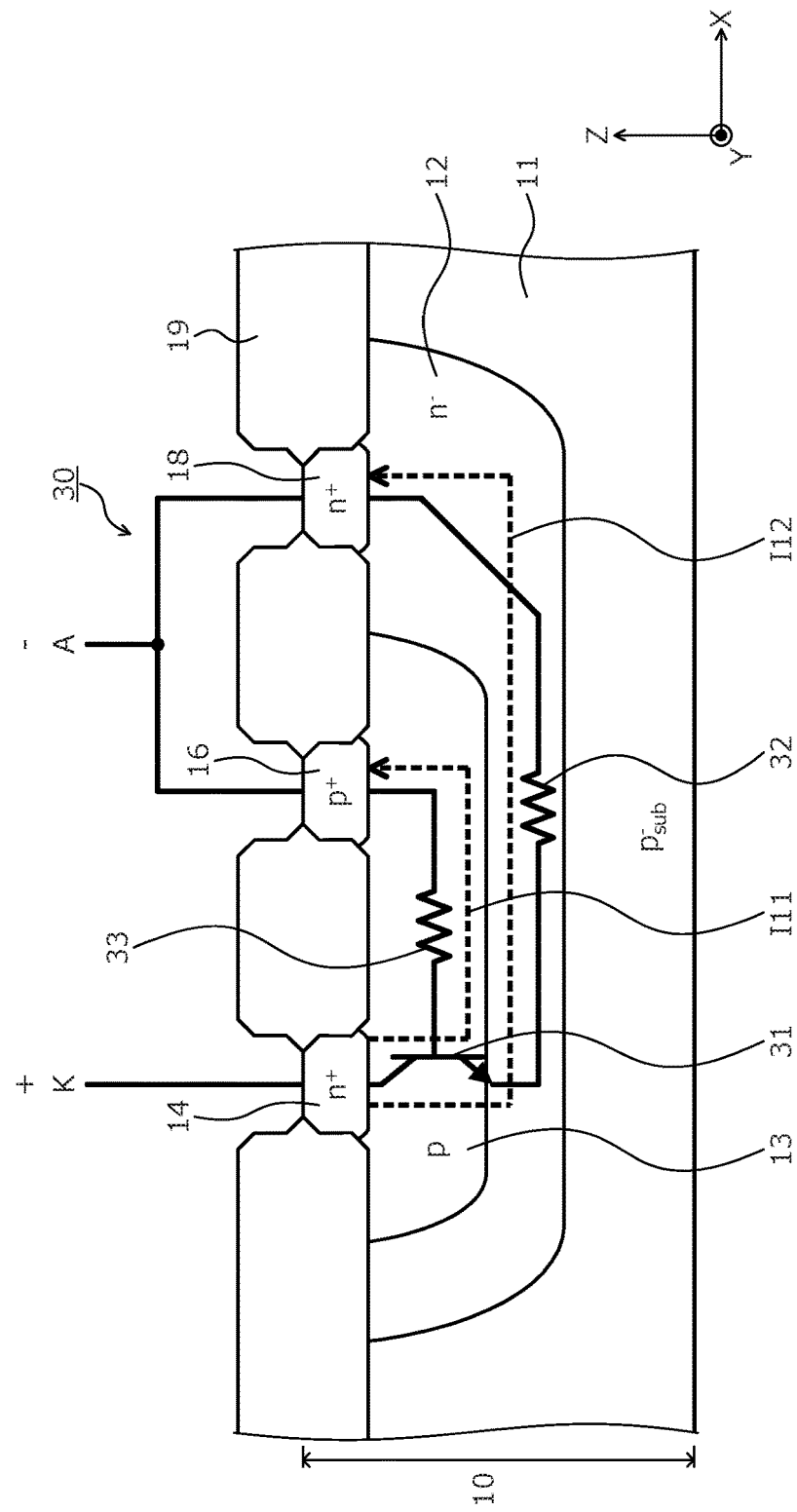
FIG. 3 is a cross-sectional view of a structure of a semiconductor circuit device of a comparison example.

For example, for comparison, a first Zener diode 30 (hereinafter, comparison example) in which the n⁺-type pickup contact region 18 is arranged at a position closer to the p⁺-type anode contact region 16 than in the semiconductor circuit device according to the embodiment (hereinafter, the example) depicted in FIG. 2 is depicted in FIG. 3. FIG. 3 is a cross-sectional view of a structure of a semiconductor circuit device of the comparison example. In the comparison example depicted in FIG. 3, the n⁺-type pickup contact region 18 is arranged at a position separated farther from the n⁺-type cathode region 14 than from the p⁺-type anode contact region 16. In this case, an electron current I12 that flows from the n⁺-type cathode region 14 to the n⁺-type pickup contact region 18 at the time of operation (parasitic operation) of a parasitic npn bipolar transistor 31 passes through a part of the n⁻-type well region 12 facing the V-type anode contact region 16 in the depth direction Z, across the p-type anode region 13 (the part beneath the p-type anode region 13) and reaches the n⁺-type pickup contact region 18. Therefore, a distance that the electron current I12 flows in the high-resistance n⁻-type well region 12 increases and a resistance value of resistance (diffusion resistance) 32 of a current path of the electron current I12 increases. Therefore, at a location where the electron current I12 concentrates, the semiconductor substrate 10 generates heat, leading to element destruction. In the comparison example, the current path of the electron current I12 that flows at the time of operation of the parasitic npn bipolar transistor 31 is a path from the n⁺-type cathode region 14 to the p-type anode region 13, the n⁻-type well region 12, and the n⁺-type pickup contact region 18. Reference numeral 33 represents resistance of a current path of an electron current I11 that flows in the first Zener diode 30 before the operation of the parasitic npn bipolar transistor 31.

On the other hand, in the example depicted in FIG. 2, as described above, the n⁺-type pickup contact region 18 is arranged at a position that is near the n⁺-type cathode region 14 and separated farther from the p⁺-type anode contact region 16 than the n⁺-type cathode region 14. In this case, the electron current I2 flowing from the n⁺-type cathode region 14 to the n⁺-type pickup contact region 18 at the time of operation (parasitic operation) of the parasitic npn bipolar transistor 21 passes through the pn junction of the n⁺-type cathode region 14 through which electrons easily pass and the p⁻-type low-concentration anode region 15, and reaches the part of the n⁻-type well region 12 beneath the p-type anode region 13. Subsequently, the electron current I2 flows to the n⁺-type pickup contact region 18 arranged at a relatively close position as compared to the comparison example. Therefore, a distance that the electron current I2 flows in the high-resistance n⁻-type well region 12 is shorter than that in the comparison example and a resistance value of resistance 22 of a current path of the electron current I2 may be reduced. Therefore, local heat generation of the semiconductor substrate 10 may be suppressed. In the example, a power supply path of the electron current I2 that flows in the n⁻-type well region 12 at the time of operation of the parasitic npn bipolar transistor 21 is a path from the n⁺-type cathode region 14 to the p⁻-type low-concentration anode region 15, the p-type anode region 13, the n⁻-type well region 12, the n-type pickup region 17, and the n⁺-type pickup contact region 18.

The parasitic npn bipolar transistor 21 is a parasitic element that uses the n⁺-type cathode region 14 as a collector, uses the p⁻-type low-concentration anode region 15 and the p-type anode region 13 as a base, and uses the n⁻-type well region 12, the n-type pickup region 17 and the n⁺-type pickup contact region 18 as an emitter. When overvoltage such as surge voltage is applied to the power supply line 1, the parasitic npn bipolar transistor 21 operates using, as a base current, an electron current I1 flowing from the n⁺-type cathode region 14 to the p⁺-type anode contact region 16. The electron current I1 is current generated by an application of voltage at the power supply potential Vd to the main power supply terminal 7, for example, current generated by an application of surge voltage to the main power supply terminal 7. A current path of the electron current I1 flowing in the first Zener diode 5 before operation of the parasitic npn bipolar transistor 21 is a path from the n⁺-type cathode region 14 through the p⁻-type low-concentration anode region 15, the p-type anode region 13, and the p⁺-type anode contact region 16, to the anode electrode A.

The interlayer insulating film 19 covers a part of the front surface of the semiconductor substrate 10 excluding the n⁺-type cathode region 14, the p⁺-type anode contact region 16, the n⁺-type pickup contact region 18, an n⁺-type cathode region 45, a p⁺-type anode contact region 46 and an n⁺-type contact region 47 described hereinafter. The interlayer insulating film 19 may be, for example, a thermal oxide film (SiO₂ film) formed by thermal oxidation of the front surface of the semiconductor substrate 10 by a Local Oxidation of Silicon (LOCOS) process.

Figure 4A:
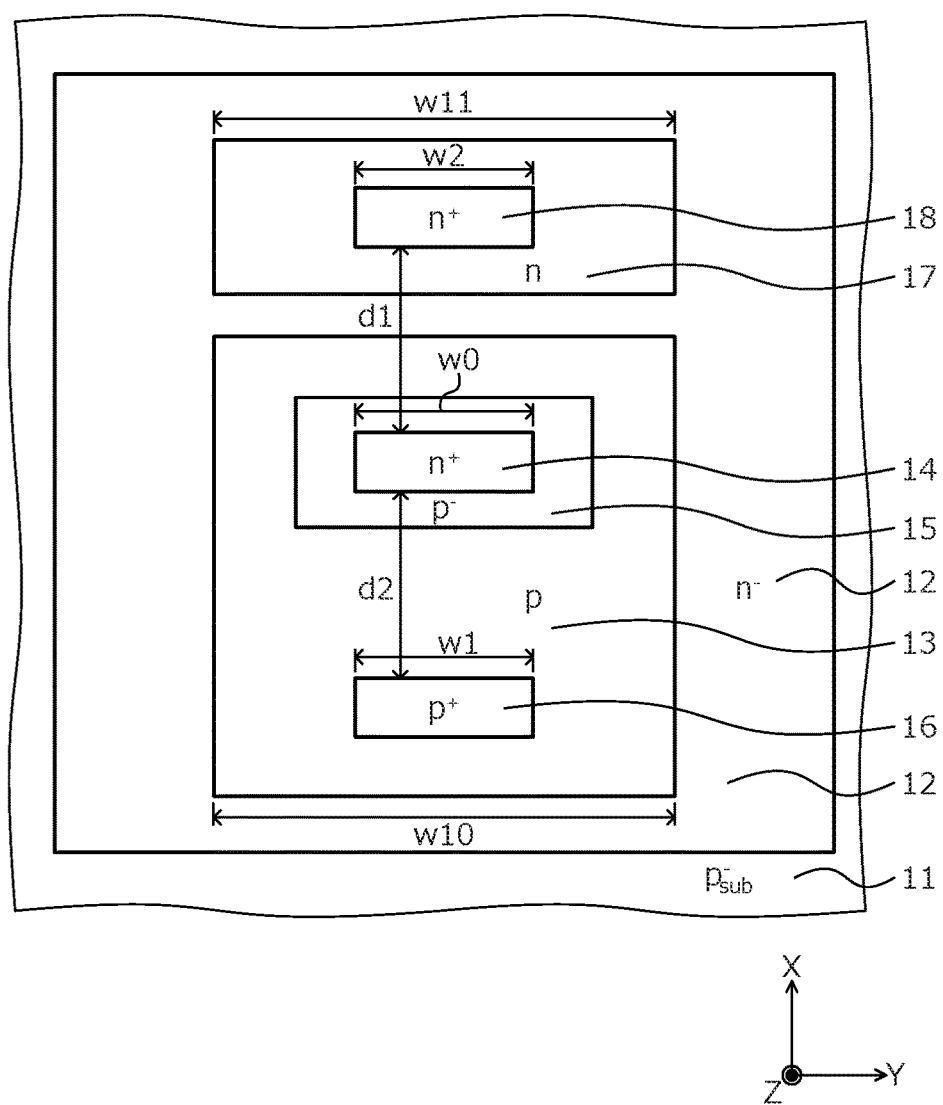
FIG. 4A is a plan view of an example of a layout of the semiconductor circuit device according to the embodiment depicted in FIG. 2 as viewed from a front surface side of a semiconductor substrate.

An example of a layout of the first Zener diode 5 as viewed from the front surface of the semiconductor substrate 10 is depicted in FIGS. 4A and 4B. FIGS. 4A and 4B are plan views of an example of a layout of the semiconductor circuit device according to the embodiment depicted in FIG. 2 as viewed from the front surface side of the semiconductor substrate. A preferred layout of the first Zener diode 5 is depicted in FIG. 4A and an example of a layout achieving an effect of the present invention is depicted in FIG. 4B. Further, the interlayer insulating film 19, the anode electrode A, and the cathode electrode K are not depicted in FIGS. 4A and 4B.

As depicted in FIG. 4A, the n⁻-type well region 12 has, for example, a substantially rectangular planar shape. The n⁻-type well region 12 is in contact with the p-type anode region 13 and the n-type pickup region 17, and surrounds peripheries of the p-type anode region 13 and the n-type pickup region 17. The p-type anode region 13 has, for example, a substantially rectangular planar shape. The p-type anode region 13 is in contact with the p⁻-type low-concentration anode region 15 and the p⁺-type anode contact region 16, and surrounds peripheries of the p⁻-type low-concentration anode region 15 and the p⁺-type anode contact region 16.

The n⁺-type cathode region 14, the p⁻-type low-concentration anode region 15, and the p⁺-type anode contact region 16 each has, for example, a substantially rectangular planar shape. The p⁻-type low-concentration anode region 15 is in contact with the n⁺-type cathode region 14 and surrounds a periphery of the n⁺-type cathode region 14. The p⁺-type anode contact region 16 is arranged separated from the p⁻-type low-concentration anode region 15. Further, the p⁺-type anode contact region 16 faces the n⁺-type cathode region 14 in a first direction X with a part of the p⁻-type low-concentration anode region 15 and a part of the p-type anode region 13 therebetween.

A width (length) w1 of a side of the p⁺-type anode contact region 16 (the side facing toward the n⁺-type cathode region 14) may be substantially a same as a width w0 of a side of the n⁺-type cathode region 14 (the side facing toward the p⁺-type anode contact region 16) (w1=w0). The side of the n⁺-type cathode region 14 and the side of the p⁺-type anode contact region 16 facing toward each other are sides parallel to a direction (hereinafter, second direction) Y that is orthogonal to the first direction X. The p⁺-type anode contact region 16 may have a substantially rectangular planar shape of substantially same dimensions as those of the n⁺-type cathode region 14.

A position of the p⁺-type anode contact region 16 in the second direction Y is, for example, equal to that of the n⁺-type cathode region 14 and the p⁺-type anode contact region 16 faces the entire side of the n⁺-type cathode region 14 facing the p⁺-type anode contact region 16. The greater the extent that the n⁺-type cathode region 14 and the p⁺-type anode contact region 16 partially facing each other (for example, making length sides face each other), the greater the magnitude of the electron current I1 flowing from the n⁺-type cathode region 14 to the p⁺-type anode contact region 16 may be increased. As a result, resistance (diffusion resistance) 23 of the current path of the electron current I1 may be reduced.

The n-type pickup region 17 and the n⁺-type pickup contact region 18 have, for example, substantially rectangular planar shapes. The n-type pickup region 17 is arranged separated from the p-type anode region 13 and faces the p-type anode region 13 in the first direction X. Further, the n-type pickup region 17 faces the p⁺-type anode contact region 16 in the first direction X with the n⁺-type cathode region 14 therebetween. The n-type pickup region 17 is in contact with the n⁺-type pickup contact region 18 and surrounds a periphery of the n⁺-type pickup contact region 18.

A width w11 of a side of the n-type pickup region 17 (the side parallel the second direction Y and facing toward the p-type anode region 13) may be substantially equal to a width w10 of a side of the p-type anode region 13 (the side parallel to the second direction Y and facing toward the n-type pickup region 17) (w11=w10). The n⁺-type pickup contact region 18 faces the n⁺-type cathode region 14 in the first direction X, with a part of the n-type pickup region 17, a part of the n⁻-type well region 12, a part of the p-type anode region 13 and a part of the p⁻-type low-concentration anode region 15 therebetween.

In addition, the n⁺-type pickup contact region 18 faces the p⁺-type anode contact region 16 in the first direction X, with the n⁺-type cathode region 14 therebetween. A distance (linear distance) d1 between the n⁺-type pickup contact region 18 and the n⁺-type cathode region 14 is shorter than a distance between the n⁺-type pickup contact region 18 and the p⁺-type anode contact region 16, and may be shorter than a distance d2 between the p⁺-type anode contact region 16 and the n⁺-type cathode region 14.

A length of the current path of the electron current I2 flowing in the n⁻-type well region 12 at the time of operation of the parasitic npn bipolar transistor 21 becomes shortest by arrangement of the n⁺-type pickup contact region 18 in this manner. The current path of the electron current I2 is a path from the n⁺-type cathode region 14, through the p⁻-type low-concentration anode region 15, the p-type anode region 13, the n⁻-type well region 12, the n-type pickup region 17 and the n⁺-type pickup contact region 18, to the anode electrode A.

Shortening of the current path of the electron current I2 flowing in the n⁻-type well region 12 at the time of operation of the parasitic npn bipolar transistor 21 enables the distance that the electron current I2 flows through the high-resistance n⁻-type well region 12 to be reduced. Therefore, resistance of the current path of the electron current I2 may be reduced. Further, the electron current I2 may be passed as soon as possible from the n⁺-type pickup contact region 18 to the outside.

Arrangement of the n⁺-type pickup contact region 18 to face the p⁺-type anode contact region 16 in the first direction X, with the n⁺-type cathode region 14 therebetween enables increases in device area to be suppressed. Therefore, at the time of operation of the parasitic npn bipolar transistor 21, resistance of the current path of the electron current I2 flowing in the n⁻-type well region 12 may be reduced while increases in device area are suppressed.

A width w2 of a side of the n⁺-type pickup contact region 18 (the side parallel to the second direction Y and facing toward the n⁺-type cathode region 14) may be substantially a same as the width w0 of the side of the n⁺-type cathode region 14 (the side parallel to the second direction Y and facing toward the n⁺-type pickup contact region 18) (w2=w0). The n⁺-type pickup contact region 18 may have a substantially rectangular planar shape of substantially same dimensions as those of the n⁺-type cathode region 14. A position of the n⁺-type pickup contact region 18 in the second direction Y may be equal to that of the n⁺-type cathode region 14 and the n⁺-type pickup contact region 18 faces the entire side of the n⁺-type cathode region 14 facing toward the n⁺-type pickup contact region 18.

The greater the extent that the n⁺-type cathode region 14 and the n⁺-type pickup contact region 18 partially face each other (for example, making length side face each other), the greater the magnitude of the electron current I2 flowing from the n⁺-type cathode region 14 to the n⁺-type pickup contact region 18 during operation (parasitic operation) of the parasitic npn bipolar transistor 21 may be increased. As a result, the resistance (diffusion resistance) 22 of the current path of the electron current I2 flowing from the n⁺-type cathode region 14 to the n⁺-type pickup contact region 18 may be reduced.

As depicted in FIG. 4B, the n⁺-type pickup contact region 18 may be arranged to face the n⁺-type cathode region 14 along the second direction Y. In this case, a width w21 of a side of the n⁺-type pickup contact region 18 (the side parallel to the first direction X and facing toward the n⁺-type cathode region 14) may be substantially a same as a width w20 of a side of the n⁺-type cathode region 14 (the side parallel to the first direction X and facing toward the n⁺-type pickup contact region 18) (w21=w20). Although not depicted, the n⁺-type pickup contact region 18 may be arranged to face the n⁺-type cathode region 14 in both the first and second directions X, Y.

Further, although not depicted, the p-type anode region 13 may be arranged in a substantially rectangular planar shape, and the n⁺-type cathode region 14 may be arranged in the p-type anode region 13 and may have a substantially rectangular shape surrounding a periphery of the p⁺-type anode contact region 16. In addition, the n-type pickup region 17 may be arranged separated from the p-type anode region 13 and may have a substantially rectangular shape surrounding a periphery of the p-type anode region 13, and the n⁺-type pickup contact region 18 may be arranged in the n-type pickup region 17 and may have a substantially rectangular shape surrounding the periphery of the p-type anode region 13.

Alternatively, the n$^+$-type pickup contact region 18 may be arranged in the n-type pickup region 17 having a substantially rectangular planar shape. In addition, the p-type anode region 13 may be arranged separated from the n-type pickup region 17 and may have a substantially rectangular shape surrounding the n-type pickup region 17. The n$^+$-type cathode region 14 and the p$^+$-type anode contact region 16 may be arranged in order stated from the n$^+$-type pickup contact region 18, where the n$^+$-type cathode region 14 and the p$^+$-type anode contact region 16 are arranged in the p-type anode region 13 and have a substantially circular shape surrounding a periphery of the n$^+$-type pickup contact region 18.

A cross-sectional structure of the second Zener diodes 6 is depicted in FIG. 5. FIG. 5 is a cross-sectional view of a structure of the second Zener diodes depicted in FIG. 1. As depicted in FIG. 5, the second Zener diodes 6 (6a to 6c) are horizontal diodes formed by pn junctions of a p-type anode region 44 and the n$^+$-type cathode region 45 selectively provided in the front surface side of the same semiconductor substrate 10 as that of the first Zener diode 5, the horizontal diodes having an anode electrode A' and a cathode electrode K' provided on the substrate front surface side.

The second Zener diodes 6a to 6c, for example, have a same cross-sectional structure and are arranged serially. The second Zener diodes 6 differ from the first Zener diode 5 on the following two points. A first difference is that the p$^-$-type low-concentration anode region and the n-type pickup region are not provided. The second difference is that the n$^+$-type cathode region 45 and the n$^+$-type contact region 47 are short-circuited, and the n$^-$-type well region 43 and the p-type anode region 44 have a same potential.

In particular, in the surface layer of the front surface of the semiconductor substrate 10, the n$^-$-type well region 43 is selectively provided separated from n$^-$-type well region 12 of the first Zener diode 5. The n$^-$-type well region 43 is a diffusion region formed by diffusion of an n-type impurity implanted in the semiconductor substrate 10. A count of the n$^-$-type well regions 43 is a same as that of the second Zener diodes 6 (here, 3), and the n$^-$-type well regions 43 are provided separated from each other. The n$^-$-type well region 43 is electrically connected to the n$^+$-type cathode region 45, via the n$^+$-type contact region 47 described hereinafter, and is fixed at a potential higher than the ground potential GND of the p$^-$-type substrate region 11.

The n$^-$-type well region 43 has a function of preventing short-circuiting of the n$^+$-type cathode region 45 and the p$^-$-type substrate region 11, and fixing the n$^+$-type cathode region 45 at a predetermined potential. The p$^-$-type substrate region 11 and the n$^-$-type well region 43 are junction isolated by the pn junction of the p$^-$-type substrate region 11 and the n$^-$-type well region 43. Further, a predetermined breakdown voltage of the second Zener diode 6 is secured by a depletion layer spreading from the pn junction of the p$^-$-type substrate region 11 and the n$^-$-type well region 43 to the p$^-$-type substrate region 11 and the n$^-$-type well region 43, respectively.

The p-type anode region 44 and the n$^+$-type contact region 47 are selectively provided in the n$^-$-type well region 43, in the surface layer on the substrate front surface side thereof. The p-type anode region 44 is a diffusion region formed by diffusion of a p-type impurity implanted in the n$^-$-type well region 43. The n$^+$-type cathode region 45 and the p$^+$-type anode contact region 46 are selectively provided in the p-type anode region 44.

The n$^+$-type cathode region 45 is a diffusion region formed by diffusion of an n-type impurity implanted in the p-type anode region 44. The p$^+$-type anode contact region 46 is a diffusion region formed by diffusion of a p-type impurity implanted in the p-type anode region 44. The n$^+$-type cathode region 45 and the p$^+$-type anode contact region 46 are exposed at the front surface of the semiconductor substrate 10. The p$^+$-type anode contact region 46 is provided separated from the n$^+$-type cathode region 45.

Further, the n$^+$-type cathode region 45 of the second Zener diode 6a that is of the second stage (highest potential of the second Zener diodes 6) is electrically connected to the anode electrode A (refer to FIG. 2) of the first Zener diode 5 of the first stage, via the cathode electrode K'. The n$^+$-type cathode regions 45 of the second Zener diodes 6b and 6c of the third and fourth stages are respectively connected to the anode electrodes A' of the second Zener diodes 6a and 6b of the second and third stages (in descending order of potential), via the respective cathode electrodes K'.

The p$^+$-type anode contact regions 46 of the second Zener diodes 6a and 6b at the second and third stages are electrically connected to the cathode electrodes K' of the second Zener diodes 6b and 6c of the third and fourth stages (in descending order of potential), via the respective anode electrodes A'. The p$^+$-type anode contact region 46 of the second Zener diode 6c of the fourth stage (lowest potential) is electrically connected to the ground line 2 (refer to FIG. 1), via the anode electrode A' and an anode pad 42 (electrode pad).

The n$^+$-type contact region 47 is a diffusion region formed by diffusion of an n-type impurity implanted in the n$^-$-type well region 43. Further, the n$^+$-type contact region 47 is provided separated from the p-type anode region 44. The n$^+$-type contact region 47 is electrically connected to the n$^+$-type cathode region 45, via the anode electrode A'. In other words, as described above, the first Zener diode 5 short-circuits the p$^+$-type anode contact region 16 and the n$^+$-type pickup contact region 18 while the second Zener diode 6 short-circuits the n$^+$-type cathode region 45 and the n$^+$-type contact region 47.

By the short-circuiting of the n$^+$-type contact region 47 and the n$^+$-type cathode region 45, the pn junction of the p$^-$-type substrate region 11 and the n$^-$-type well region 43 are reverse biased, and the p$^-$-type substrate region 11 and the n$^-$-type well region 43 are junction isolated. Further, by the short-circuiting of the n$^+$-type contact region 47 and the n$^+$-type cathode region 45, the n$^-$-type well region 43 and the p-type anode region 44 are at a same potential and therefore, the second Zener diode 6 has a structure in which parasitic operation (operation of a parasitic pnp bipolar transistor formed by the p-type anode region 44, the n$^-$-type well region 43 and the p$^-$-type substrate region 11) does not occur. Therefore, short-circuiting of the n$^+$-type cathode region 45 and the p$^-$-type substrate region 11 does not occur.

Since the second Zener diode 6 has the structure in which parasitic operation does not occur, compared to the first Zener diode 5 that has the parasitic npn bipolar transistor 21, operation resistance is low, and the predetermined voltage for achieving the clamp voltage is reached sooner. In other words, resistance 48 of the current path of the electron current I1 flowing in the second Zener diodes 6 is lower than the resistance 23 of the current path of the electron current I1 flowing in the first Zener diode 5 before operation of the parasitic npn bipolar transistor 21. The current path of the electron current I1 flowing in the second Zener diodes 6 is a path from the $n^+$-type cathode region 45 to the p-type anode region 44 and the $p^+$-type anode contact region 46.

Clamp operation of the constant voltage clamping circuit 4 will be described with reference to FIGS. 2 and 5. The current paths of the electron currents I1, I2 are depicted in only FIG. 2. When voltage of a high potential is applied to the ground terminal 8 by the main power supply terminal 7, the electron current I1 flows in the first Zener diode 5 (first stage) along a current path from the $n^+$-type cathode region 14 to the $p^-$-type low-concentration anode region 15, the p-type anode region 13 and the $p^+$-type anode contact region 16. The electron current I1 flows from the $p^+$-type anode contact region 16 of the first Zener diode 5 to the downstream second Zener diodes 6a to 6c (second to fourth stages) sequentially, along a current path from the $n^+$-type cathode region 45 to the p-type anode region 44 and the $p^+$-type anode contact region 46, and out through the anode pad 42, from the $p^+$-type anode contact region 46 of the second Zener diode 6c of the fourth stage.

When the magnitude of the electron current flowing in the first and second Zener diodes 5, 6 increases and the voltage of the power supply line 1 reaches the clamp voltage, the parasitic npn bipolar transistor 21 operates (parasitic operation) using, as a base current, the electron current I1 flowing from the $n^+$-type cathode region 14 of the first Zener diode 5 to the $p^+$-type anode contact region 16. Due to the parasitic operation of the parasitic npn bipolar transistor 21, the electron current I2 flows along a current path from the $n^+$-type cathode region 14 to the $p^-$-type low-concentration anode region 15, the p-type anode region 13, the $n^-$-type well region 12, the n-type pickup region 17, and the $n^+$-type pickup contact region 18. In other words, when the voltage of the power supply line 1 reaches the clamp voltage, the current path of the electron current flowing in the first Zener diode 5 changes.

Figure 6:
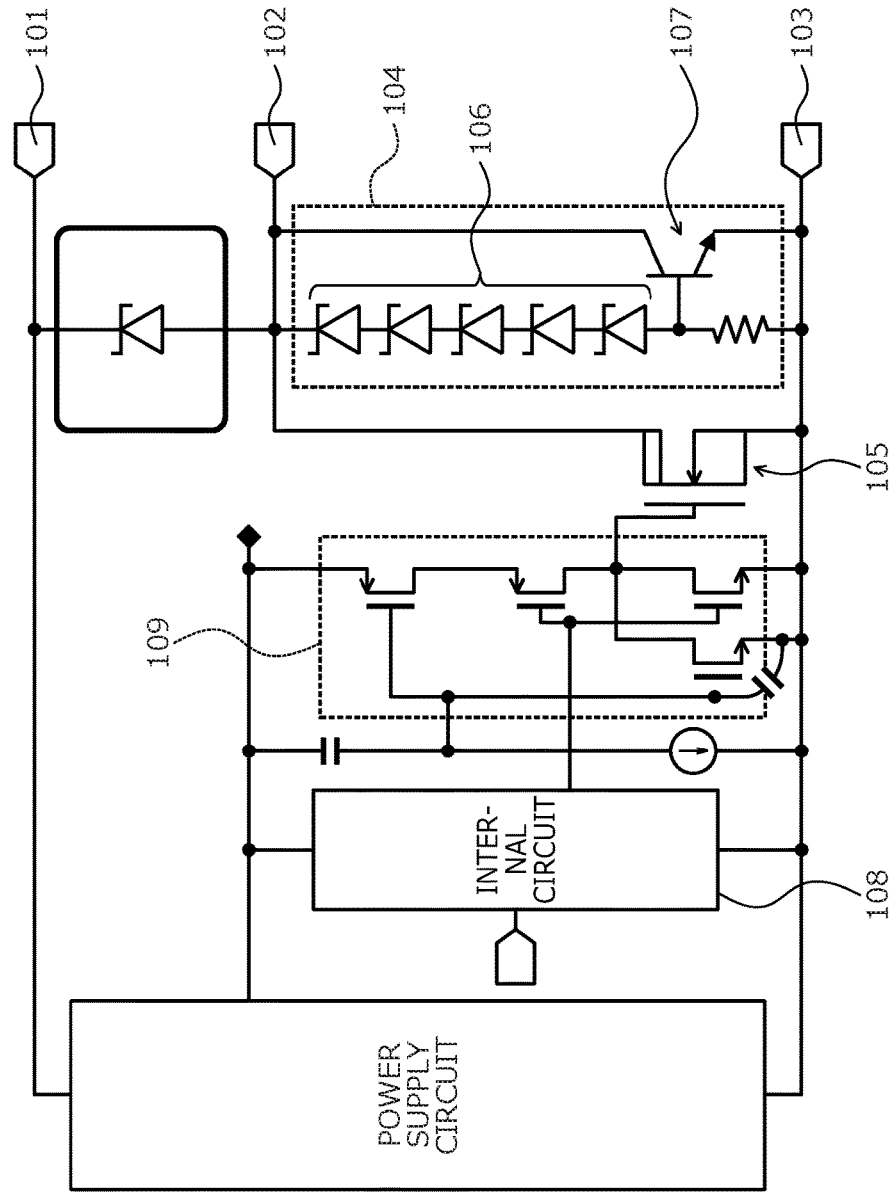
FIG. 6 is a circuit diagram of an example of a semiconductor circuit device having a conventional constant voltage clamping circuit.

The first Zener diode 5 has the $p^-$-type low-concentration anode region 15 as described above, whereby a configuration is achieved in which the injection efficiency of the majority carriers is improved and carrier recombination is reduced. Therefore, compared to the conventional structure (refer to FIGS. 6 and 7) not provided with the $p^-$-type low-concentration anode region 15, the apparent value of the resistance 23 of the current path of the electron current I1 flowing in the first Zener diode 5 before the operation of the parasitic npn bipolar transistor 21 is low and the voltage of the power supply line 1 reaches the clamp voltage sooner. Therefore, compared to the conventional structure, energy loss (=voltage×current) of the first Zener diode 5 may be reduced and the device area (element dimensions) may be reduced. Further, after the voltage of the power supply line 1 reaches the clamp voltage, the electron current I2 flowing in the $n^-$-type well region 12 is pulled out from the $n^+$-type pickup contact region 18 by the parasitic operation of the parasitic npn bipolar transistor 21. As a result, without changing the device area, the allowed current capacity for the parasitic pnp bipolar transistor, which is formed by the p-type anode region 13, the $n^-$-type well region 12 and the $p^-$-type substrate region 11, to transition to parasitic operation may be made greater than that of the conventional structure. Alternatively, without changing the allowed current capacity for the parasitic pnp bipolar transistor to transition to parasitic operation, the device area may be made smaller than that of the conventional structure.

Further, the value of the resistance 23 of the current path of the electron current I1 flowing in the first Zener diode 5 before operation of the parasitic npn bipolar transistor 21 and a value of the resistance 48 of the current path of the electron current I1 flowing in the second Zener diodes 6 may be set to resistance values as low as possible. A reason for this is as follows. The lower the values of the resistance 23, 48 of the current paths of the electron current I1 flowing in the first and the second Zener diodes 5 and 6 is, the lower the energy loss at the first and the second Zener diodes 5 and 6 is and the sooner the voltage of the power supply line 1 reaches the clamp voltage. As a result, the parasitic npn bipolar transistor 21 may be caused to operate sooner and short-circuit capability of the $n^+$-type cathode region 14 and the $p^-$-type substrate region 11 may be improved.

As described, according to the embodiment, the $p^+$-type anode contact region and the $n^+$-type pickup contact region of the first Zener diode are short-circuited. As a result, after the voltage of the power supply line reaches the clamp voltage, due to the parasitic operation of the parasitic npn bipolar transistor formed by the $n^+$-type cathode region, the $p^-$-type low-concentration anode region, the p-type anode region, the $n^-$-type well region, the n-type pickup region and the $n^+$-type pickup contact region of the first Zener diode, the electron current flowing in the $n^-$-type well region of the first Zener diode may be pulled outside from the $n^+$-type pickup contact region. Therefore, the allowed current capacity for the parasitic pnp bipolar transistor formed by the p-type anode region, the $n^-$-type well region and the $p^-$-type substrate region of the first Zener diode to transition to parasitic operation may be increased.

In this manner, the allowed current capacity for the parasitic pnp bipolar transistor, which flows short-circuit current between the power supply terminal and the ground terminal, to transition to parasitic operation may be increased, whereby the occurrence of a current path along which surge current flows directly to the $p^-$-type substrate region is suppressed. Therefore, short-circuiting of the $n^+$-type cathode region (main power supply terminal) and the $p^-$-type substrate region (ground terminal) of the first Zener diode may be suppressed, and element destruction caused by locally generated heat in the semiconductor substrate may be suppressed. Further, according to the embodiment, the allowed current capacity for the parasitic pnp bipolar transistor to transition to parasitic operation may be increased while the size (element dimensions) of the parasitic pnp bipolar transistor formed by the p-type anode region, the $n^-$-type well region and the $p^-$-type substrate region of the first Zener diode is maintained. Alternatively, the chip size may be reduced while the allowed current capacity for the parasitic pnp bipolar transistor to transition to parasitic operation is maintained.

According to the embodiment, since the allowed current capacity for the parasitic pnp bipolar transistor to transition to parasitic operation may be increased, the size (element dimensions) of the bipolar device does not have to be increased to reduce the current density of the bipolar device. Therefore, the chip area (chip size) may be maintained and increases in cost accompanying increases in chip area may be prevented. Further, according to the embodiment, the $n^+$-type pickup contact region is arranged at a position that is near the $n^+$-type cathode region and a position that is separated farther than the $n^+$-type cathode region, from the $p^+$-type anode contact region. As a result, the distance that the electron current flows in the high-resistance $n^-$-type well region during operation of the parasitic pnp bipolar transistor is reduced, enabling the value of the resistance of the current path of the electron current to be reduced and the local generation of heat in the semiconductor substrate to be suppressed. Thus, element destruction at locations where heat concentrates may be suppressed.

According to the embodiment, provision of the p⁻-type low-concentration anode region between the n⁺-type cathode region and the p-type anode region of the first Zener diode connected at the highest potential side of the constant voltage clamping circuit increases the impurity concentration difference of the cathode region and the anode region. As a result, in the first Zener diode, the injection efficiency of the majority carrier may be improved and carrier recombination may be reduced. Therefore, operation resistance (impedance) of the first Zener diode may be lowered with respect to the large current (surge current) generated when surge voltage is applied to the main power supply terminal. Therefore, energy loss at the first Zener diode is low and the voltage of the power supply line reaches the clamp voltage soon, enabling the current path of the electron current to be switched to the current path resulting from the parasitic operation of the parasitic npn bipolar transistor soon.

The present invention is not limited to the embodiment above and various modifications within a scope not deviating from the spirit of the invention are possible. For example, of the Zener diodes configuring the constant voltage clamping circuit, when one Zener diode of the highest potential is used as the first Zener diode above, while an effect of the invention is obtained, without limitation hereto, of the Zener diodes configuring the constant voltage clamping circuit, two or more Zener diodes of high potentials may be used as the first Zener diode, or the first Zener diode alone may configure the constant voltage clamping circuit.

According to an embodiment of the invention, after the voltage of the power supply line reaches the clamp voltage due to the electron current flowing from the first semiconductor region to the second to fourth semiconductor regions, the electron current flowing in the first semiconductor region due to the parasitic operation of the parasitic npn bipolar transistor formed by the first to third and fifth to seventh semiconductor regions may be pulled outside from the sixth semiconductor region. As a result, the occurrence of a current path along which surge current flows directly to the second-conductivity-type region is suppressed, enabling short-circuiting of the first semiconductor region (main power supply terminal) and the second-conductivity-type region (ground terminal) to be suppressed.

The semiconductor device and the semiconductor circuit device according to an embodiment of the present invention achieve an effect in that the allowed current capacity for a parasitic element, which flows short-circuit current between the power supply terminal and the ground terminal, to transition to parasitic operation may be increased without increasing the chip.

As described, the semiconductor device and the semiconductor circuit device according to an embodiment of the present invention are useful for clamping circuits that prevent surge voltage from being input to circuits connected to a power supply line.

In the present specification and claims, different regions of a semiconductor device having different conductivity types are described as being "provided" and "selectively provided" in other regions having other conductivity types. In the present specification and claims, referring to one region of one conductivity type as being "provided in" a second region of a second conductivity type means that during a formation process, certain portions of the second region are altered to have different conductivity types than other portions. It is not to be understood as one material having two conductivity types in the same place at the same time. In other words, the portion of the second region having the first region provided therein no longer has the second conductivity type. The feature of different regions being formed and existing at different places within a semiconductor substrate is clearly shown in the Figures provided herewith.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a semiconductor substrate;
   a first first-conductivity-type region of a first conductivity type selectively provided in a surface layer of a front surface of the semiconductor substrate;
   a first semiconductor region of a second conductivity type selectively provided in the first first-conductivity-type region;
   a second semiconductor region of the second conductivity type selectively provided in the first semiconductor region, an impurity concentration of the second semiconductor region being lower than an impurity concentration of the first semiconductor region;
   a third semiconductor region of the first conductivity type selectively provided in the second semiconductor region;
   a fourth semiconductor region of the second conductivity type selectively provided in the first semiconductor region, the fourth semiconductor region being provided separated from the second semiconductor region, an impurity concentration of the fourth semiconductor region being higher than the impurity concentration of the first semiconductor region;
   a fifth semiconductor region of the first conductivity type selectively provided in the first first-conductivity-type region, the fifth semiconductor region being provided separated from the first semiconductor region;
   a sixth semiconductor region of the first conductivity type selectively provided in the fifth semiconductor region, an impurity concentration of the sixth semiconductor region being higher than an impurity concentration of the fifth semiconductor region;
   a second-conductivity-type region that is a part of the semiconductor substrate excluding the first first-conductivity-type region;
   a first electrode electrically connected to the third semiconductor region; and
   a second electrode electrically connected to the fourth semiconductor region and the sixth semiconductor region, wherein
   the sixth semiconductor region is arranged at a position that is a greater distance from the fourth semiconductor region than from the third semiconductor region and on a same side of the fourth semiconductor region as the third semiconductor region.

2. The semiconductor device according to claim 1, further comprising an interlayer insulating film arranged linearly between the third semiconductor region and the fourth semiconductor region, and between the third semiconductor region and the sixth semiconductor region.

3. The semiconductor device according to claim 1, wherein
   the third semiconductor region, the fourth semiconductor region, and the sixth semiconductor region protrude outward from the second semiconductor region, the first semiconductor region, and the fifth semiconductor region, respectively.

4. The semiconductor device according to claim 1, wherein
the third semiconductor region is arranged between the sixth semiconductor region and the fourth semiconductor region.

5. A semiconductor circuit device comprising:
a first circuit including a plurality of diodes connected serially, the plurality of diodes including a first diode of a highest potential thereamong, the first diode being a semiconductor device including:
  a first first-conductivity-type region of a first conductivity type selectively provided in a surface layer of a front surface of a semiconductor substrate;
  a first semiconductor region of a second conductivity type selectively provided in the first first-conductivity-type region;
  a second semiconductor region of the second conductivity type selectively provided in the first semiconductor region, an impurity concentration of the second semiconductor region being lower than an impurity concentration of the first semiconductor region;
  a third semiconductor region of the first conductivity type selectively provided in the second semiconductor region;
  a fourth semiconductor region of the second conductivity type selectively provided in the first semiconductor region, the fourth semiconductor region being provided separated from the second semiconductor region, an impurity concentration of the fourth semiconductor region being higher than the impurity concentration of the first semiconductor region;
  a fifth semiconductor region of the first conductivity type selectively provided in the first first-conductivity-type region, the fifth semiconductor region being provided separated from the first semiconductor region;
  a sixth semiconductor region of the first conductivity type selectively provided in the fifth semiconductor region, an impurity concentration of the sixth semiconductor region being higher than an impurity concentration of the fifth semiconductor region;
  a second-conductivity-type region that is a part of the semiconductor substrate excluding the first first-conductivity-type region;
  a first electrode electrically connected to the third semiconductor region; and
  a second electrode electrically connected to the fourth semiconductor region and the sixth semiconductor region,
wherein the sixth semiconductor region is arranged at a position that is a greater distance from the fourth semiconductor region than from the third semiconductor region and on a same side of the fourth semiconductor region as the third semiconductor region
wherein the semiconductor circuit device further comprises:
  a first terminal;
  a second terminal of a potential lower than a potential of the first terminal; and
  a second circuit connected between the first terminal and the second terminal,
wherein the first circuit is connected between the first terminal and the second circuit, in parallel with the second circuit,
wherein the plurality of diodes are connected serially between the first terminal and the second terminal, each having a cathode on a first terminal side and an anode on a second terminal side,
wherein the first electrode is electrically connected to the first terminal, and
wherein the second electrode is electrically connected to the cathode of a second diode that is nearest the first terminal, among the plurality of diodes excluding the first diode.

6. The semiconductor circuit device according to claim 5, wherein
a diode of the plurality of diodes, excluding the first diode, includes:
  a second first-conductivity-type region of the first conductivity type selectively provided in the surface layer of the front surface of the semiconductor substrate, the second first-conductivity-type region being provided separated from the first first-conductivity-type region;
  a seventh semiconductor region of the second conductivity type selectively provided in the second first-conductivity-type region;
  an eighth semiconductor region of the first conductivity type selectively provided in the seventh semiconductor region;
  a ninth semiconductor region of the second conductivity type selectively provided in the seventh semiconductor region, the ninth semiconductor region being provided separated from the eighth semiconductor region, an impurity concentration of the ninth semiconductor region being higher than an impurity concentration of the seventh semiconductor region;
  a tenth semiconductor region of the first conductivity type selectively provided in the second first-conductivity-type region, the tenth semiconductor region being provided separated from the seventh semiconductor region, an impurity concentration of the tenth semiconductor region being higher than an impurity concentration of the second first-conductivity-type region;
  a third electrode electrically connected to the eighth semiconductor region and the tenth semiconductor region; and
  a fourth electrode electrically connected to the ninth semiconductor region.

7. The semiconductor circuit device according to claim 6, wherein
the third electrode of the second diode is electrically connected to the second electrode.

8. The semiconductor circuit device according to claim 6, wherein
the fourth electrode of the diode nearest the second terminal among the plurality of diodes is electrically connected to the second terminal.

9. The semiconductor circuit device according to claim 5, wherein
the first terminal is a power supply terminal,
the second terminal is a ground terminal, and
the first circuit is a protection circuit protecting the second circuit from overvoltage applied to the first terminal.

* * * * *